United States Patent
Lin et al.

(10) Patent No.: US 9,099,530 B2
(45) Date of Patent: *Aug. 4, 2015

(54) METHODS OF PATTERNING SMALL VIA PITCH DIMENSIONS

(71) Applicant: Taiwan Semiconductor Manufacturing Company, Ltd., Hsin-Chu (TW)

(72) Inventors: Chung-Yi Lin, Hsinchu County (TW); Jiing-Feng Yang, Hsinchu County (TW); Tzu-Hao Huang, Hsinchu County (TW); Chih-Hao Hsieh, Taipei (TW); Dian-Hau Chen, Hsinchu (TW); Hsiang-Lin Chen, Hsinchu (TW); Ko-Bin Kao, Taichung County (TW); Yung-Shih Cheng, Hsinchu (TW)

(73) Assignee: Taiwan Semiconductor Manufacturing Compnay, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/273,080

(22) Filed: May 8, 2014

(65) Prior Publication Data

US 2014/0242794 A1 Aug. 28, 2014

Related U.S. Application Data

(63) Continuation of application No. 13/465,343, filed on May 7, 2012, now Pat. No. 8,728,332.

(51) Int. Cl.
*H01B 13/00* (2006.01)
*H01L 21/768* (2006.01)
*H01L 21/027* (2006.01)
*H01L 21/311* (2006.01)
*H01L 21/308* (2006.01)

(52) U.S. Cl.
CPC ...... *H01L 21/76805* (2013.01); *H01L 21/0274* (2013.01); *H01L 21/3086* (2013.01); *H01L 21/31144* (2013.01); *H01L 21/76811* (2013.01); *H01L 21/76816* (2013.01); *H01L 21/76877* (2013.01)

(58) Field of Classification Search
USPC .......................................................... 216/13
See application file for complete search history.

(56) References Cited

U.S. PATENT DOCUMENTS

| 5,741,741 | A  | * | 4/1998 | Tseng .......................... 438/637 |
| 6,100,014 | A  | * | 8/2000 | Lin et al. ...................... 430/314 |
| 6,774,051 | B2 | * | 8/2004 | Chung et al. .................. 438/778 |
| 7,572,557 | B2 |   | 8/2009 | Wallace et al.                          |

\* cited by examiner

*Primary Examiner* — Roberts Culbert
(74) *Attorney, Agent, or Firm* — Haynes and Boone, LLP

(57) ABSTRACT

Integrated circuit methods are described. The methods include providing a photomask that includes two main features for two via openings and further includes an optical proximity correction (OPC) feature linking the two main features; forming a hard mask layer on a substrate, the hard mask layer including two trench openings; forming a patterned resist layer over the hard mask layer using the photomask, wherein the patterned resist layer includes a peanut-shaped opening with two end portion aligned with the two trench openings of the hard mask layer, respectively; and performing a first etch process to the substrate using the hard mask layer and the patterned resist layer as a combined etch mask.

20 Claims, 4 Drawing Sheets

METHODS OF PATTERNING SMALL VIA PITCH DIMENSIONS

CROSS-REFERENCE TO RELATED APPLICATIONS

This application is a continuation of U.S. application Ser. No. 13/465,343, which was filed on May 7, 2012, now allowed, the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the mainstream course of IC evolution, functional density (i.e., the number of interconnected devices per chip area) has generally increased while geometry size (i.e., the smallest component that can be created using a fabrication process) has decreased. However, this mainstream evolution needs to follow the Moore's rule by a huge investment in facility establishment. Therefore, it has been a study topic that using current semiconductor technology develops more valuable ICs product.

As is well understood in the art, semiconductor devices are typically formed using multiple layers of material, including conductive, semi-conductive, and insulative layers. To provide electrical conductivity between layers in a semiconductor device, a hole or via may be formed through certain layers. The via is then lined with a barrier layer, such as Ti, TiN, or Ti/TiN, and filled with an electrically conductive material, such as a metal, to provide electrical conductivity between the layers.

Currently, a twice-photolithography-twice-etch process is typically used to provide holes or vias with pitches below 115 nm. The cost and processing time is typically double that of a single process for each via layer. Current methods involve long process times, high costs, damage to vias, and concern of via to via overlap. Back-end-of line (BEOL) process issues also need to be minimized. Thus, better methods are needed to define small via pitch dimensions.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
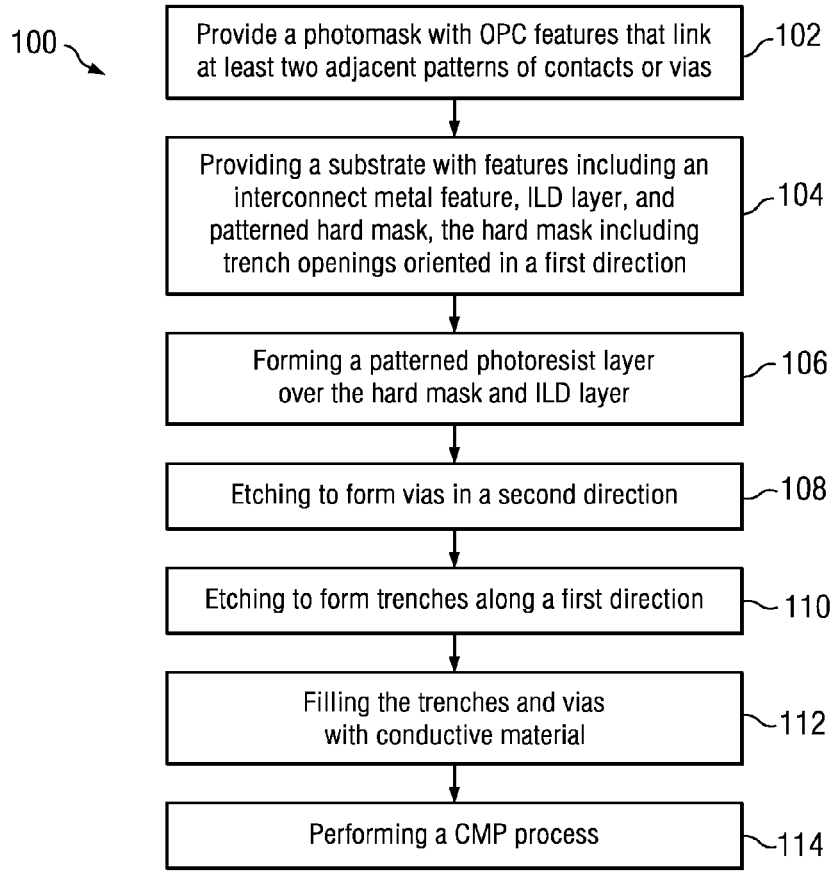
FIG. 1 is a flowchart illustrating an IC design method according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of an embodiment of a method 100 for making a IC circuit device constructed according to various aspects of the present disclosure in one or more embodiments. FIGS. 3 and 5-9 are sectional views of an IC circuit device 200 at various fabrication stages and constructed according to one or more embodiments. The IC circuit device 200 and the method 100 of making the same are collectively described with reference to FIGS. 1 through 10.

Referring to FIG. 1, shown is a flowchart of an IC method 100. The IC method 100 begins at block 102 by providing a photomask of a design layout for an IC with patterns of contacts or vias. For the present disclosure, contacts and vias are generally referred to as vias. The design layout may be a post-optical proximity correction (OPC) design pattern. However, in other embodiments, the design pattern may be any virtual or physical design pattern. The design layout is typically stored in a design layout database.

A mask pattern on a photomask that is based on the design layout is created using a mask process. The mask process is any mask process known in the art. The mask making process can be performed by a mask making system, which performs various patterning and etching processes to form the design layout pattern on the blank mask. The photomask or "reticle" includes a pattern corresponding to features at one layer in an IC design.

During data preparation to form a tape-out for photomask masking, OPC features are incorporated into the photomask. The OPC features compensate for mask patterning errors and give better wafer performance. OPC involves adding dark regions to and/or subtracting dark regions from a photomask design at locations chosen to overcome the distorting effects of diffraction and scattering. Typically, OPC is performed on a digital representation of a desired IC pattern. First, the digital pattern is evaluated with software to identify regions where optical distortion will result, and a digital representation of a photomask design is modified to create an optically corrected or OPC mask. The modification is performed by a computer having appropriate software for performing OPC.

Figure 2:
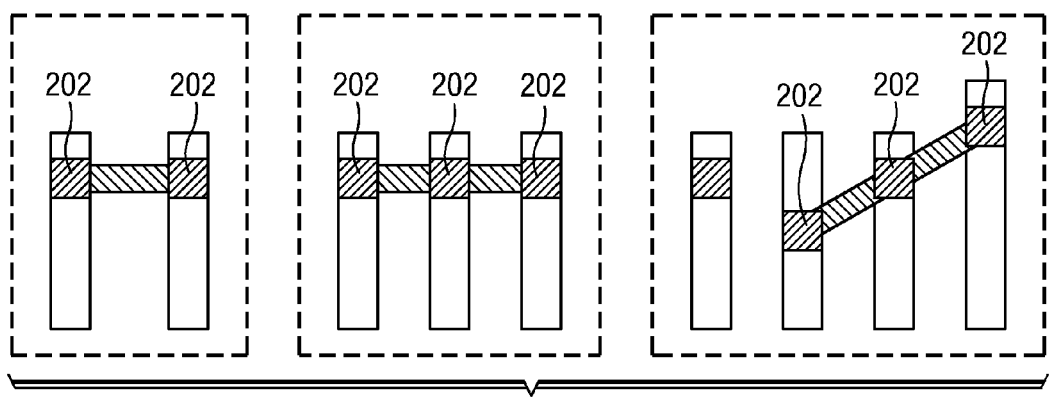
FIG. 2 illustrates adjacent vias that are linked in different directions according to aspects of the present disclosure.
Figure 4:
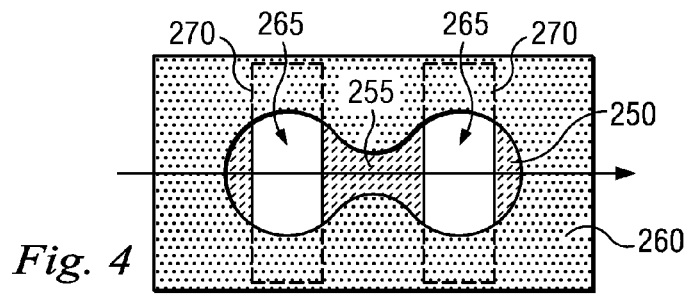
FIGS. 4 and 10 are top views of one embodiment of an IC circuit device at various fabrication stages constructed according to various aspects of the present disclosure in one or more embodiments.

In the present embodiment, an OPC feature is employed to link at least two adjacent patterns that define via openings. FIG. 2 shows that adjacent via patterns 202 may be linked by OPC features in different directions or orientations, at any angle including horizontal and diagonal. In the present embodiment, the OPC feature to link the two adjacent via patterns includes one or more sub-resolution features. The sub-resolution features are those features with a dimension less than the resolution limit of the lithography apparatus. As can be seen, two or multiple adjacent via patterns 202 may be linked. In one embodiment, the design layout after OPC, when imaged from the photomask to a resist layer coated on a semiconductor substrate, resembles a peanut or has a peanut shape as shown in FIG. 4, which is discussed further below.

Figure 3:
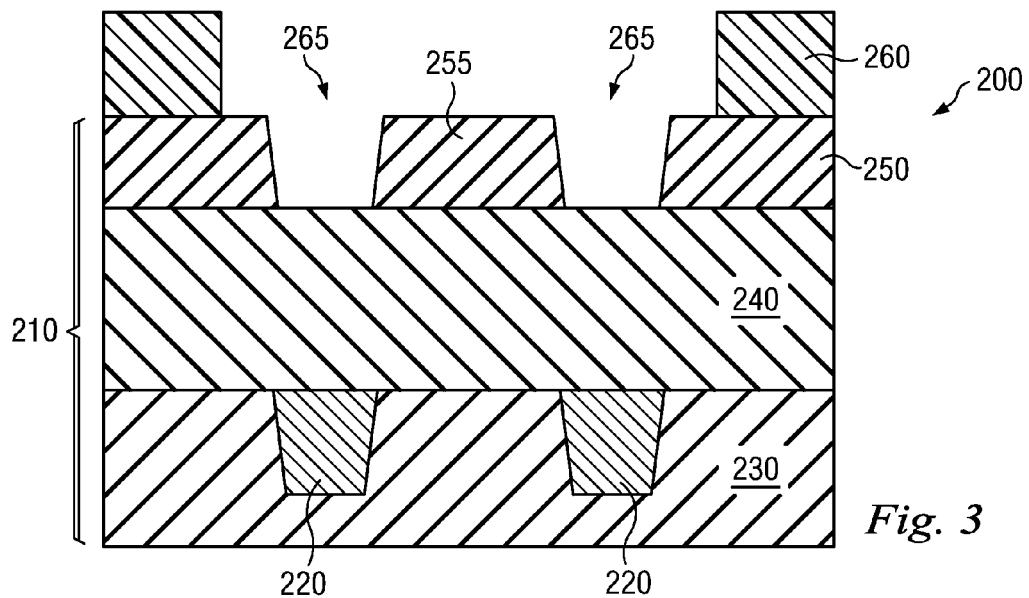
FIGS. 3 and 5-9 are sectional views of one embodiment of an IC circuit device at various fabrication stages constructed according to various aspects of the present disclosure in one or more embodiments.

Continuing to block 104 and referring to FIG. 3, an IC circuit device 200 that includes a semiconductor substrate 210 with features including an interconnect metal feature 220 in a first interlayer dielectric (ILD) layer 230, a second ILD layer 240 over interconnect metal feature 220 and a patterned hard mask 250 on ILD layer 240 is provided. Alternatively, the substrate 210 may include germanium, silicon germanium or other appropriate semiconductor materials. Also alternatively, the semiconductor substrate 210 may include an epitaxial layer. Furthermore, the substrate 210 may include a semiconductor-on-insulator (SOI) structure such as a buried dielectric layer. Also alternatively, the substrate may include a buried dielectric layer such as a buried oxide (BOX) layer, such as that formed by a method referred to as separation by implantation of oxygen (SIMOX) technology, wafer bonding, selective epitaxy growth (SEG), or other appropriate method. In fact various embodiments may include any of a variety of substrate structures and materials.

The substrate 210 may also include various doped regions such as p-wells and n-wells (not shown), formed by implantation techniques. As an example, a portion of the substrate 210 is doped p-type and formed a p-well where an n-channel device will be fabricated. The source and drain (S/D) regions (not shown) on substrate 210 are formed by a proper technique, such as one or more ion implantations. The S/D regions may further include light doped source/drain (LDD) regions substantially aligned with a gate structure and heavily doped S/D regions (not shown) substantially aligned with associated gate sidewall spacers.

The substrate 210 also includes a gate structure (not shown) formed by deposition, pattern and etch techniques. The gate structure may include a dummy gate structure. Gate sidewall spacers may be formed on the sidewalls of the gate structure. The gate sidewall spacers generally include a dielectric material such as silicon nitride ($Si_3N_4$).

Contacts are formed in the substrate 210. The contacts provide interconnection to the S/D regions and the gate structures. The contacts are a portion of a multilayer interconnection (MLI) structure of IC circuit device 200. The MLI includes vertical interconnects, such as conventional vias or contacts, and horizontal interconnects, such as metal lines. The various interconnection features may implement various conductive materials including copper, tungsten and silicide. In one example, a damascene process is used to form a MLI structure. In an embodiment, the contacts are formed by etching contact holes in first ILD layer 230. The contact holes are then filled with conductive material such as tungsten, to form interconnect metal feature 220, e.g., a contact plug. Chemical mechanical polishing (CMP) is performed on the interconnect metal feature 220 and ILD layer 230 to planarize the top surface of substrate 210.

A second ILD layer 240 is formed over interconnect metal feature 220 and ILD layer 230. The ILD layers 230 and 240 may be formed by CVD, high density plasma CVD, spin-on methods, sputtering, and/or other suitable methods. The ILD layers 230 and 240 typically include silicon oxide, silicon dioxide, SiON, a low k material, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), and/or other suitable materials. In the present embodiment, ILD layer 240 is selected to have a high etch rate compared to hard mask layer 250. In the depicted embodiment, ILD layer 240 includes silicon oxide formed by a CVD technique.

Patterned hard mask layer 250 is formed by a procedure including deposition, patterning and etching. The hard mask layer 250 is patterned to expose a portion of the ILD layer 240 to a subsequent trench etching. Patterned hard mask layer 250 may be a multiple film and include silicon nitrides ($Si_xN_y$) such as $Si_3N_4$ and $Si_2N_3$, SiON, SiOC, SiCN, metal oxides, and/or other suitable materials. In the present embodiment, hard mask layer 250 is selected to have a lower etch rate than ILD layer 240 and includes $Si_2N_3$. The hard mask layer 250 includes two trench openings that are oriented in a first direction for a future trench etching process. The hard mask layer 250 is patterned to have openings 270 that define trenches (or trench lines). Particularly, the openings 270 of the hard mask layer 250 are elongated with a length dimension oriented in a first direction. The adjacent openings 270 are spaced away in a second direction perpendicular to the first direction.

At block 106, a patterned photoresist layer (or patterned resist layer) 260 is formed over hard mask layer 250 and ILD layer 240, using the photomask having two main features linked by an OPC feature. Particularly, the openings of the patterned resist layer 260 corresponds to the image of the photomask with via patterns linked by an OPC feature. Patterned resist layer 260 includes a peanut-shaped opening 265 that defines portions for vias 285 and expose those portions to subsequent etch.

In one embodiment, patterned resist layer 260 is formed by a procedure including coating, exposure, post exposure baking, and developing. Particularly, the resist coating may utilize spin-on coating.

In one example of the exposure, the coated resist layer is selectively exposed by radiation beam through a mask having a predefined pattern. The radiation beam includes ultraviolet (UV) light in one example. The exposing process may be further extended to include other technologies such as an extreme ultraviolet (EUV) lithography. After the exposing process, patterned resist layer 260 is further processed by a thermal baking process, referred to as a post exposure bake (PEB). The PEB may induce a cascade of chemical transformations in the exposed portion of the resist layer, which is transformed to have an increased solubility of the resist in a developer. Thereafter, the resist layer on the substrate is developed such that the exposed resist portion is dissolved and washed away during the developing process. The lithography processes described above may only present a subset of processing steps associated with a lithography patterning technique. The lithography process may further include other steps such as cleaning and baking in a proper sequence. For example, the developed resist layer may be further baked, which is referred to as hard baking.

FIG. 4 shows a top view of FIG. 3, which includes a peanut-shaped opening 265 in the patterned resist layer. As can be seen, the peanut-shaped opening 265 includes two end portions aligned (or overlapped) with the trench openings 270 of the hard mask 250. A necking portion of the peanut-shaped opening 265 is landing on a portion of the hard mask layer between the two trench openings 270. The patterned hard mask layer 250 and the patterned resist layer 260 collectively define separated via openings, therefore used as a combined etch mask during via etch. The peanut shape enlarges the etch process window. The overlay window is relaxed also. Additionally, hard mask layer 250 prevents lateral etching between vias 285 within the peanut-shaped opening 265 because of its slower etch rate compared to ILD layer 240. An island feature 255 formed by a portion of the hard mask layer 250 provides a separation between two adjacent individual vias 285 during the etching process. The island feature 255 offers a self-aligned etching characteristic in the via etch to achieve a small CD individual via 285 through a large CD of the peanut-shaped opening 265.

Particularly, the trench openings 270 are elongated openings with the length dimension oriented in the first direction. The peanut-shaped opening 265 is oriented in third direction such that the two end portions of the peanut shape are spaced away in the third direction different from the first direction. In one example, the third direction is perpendicular to the first direction. In another example, the third direction is intersecting with the first direction with an angle less than 90 degree.

In the present methods, vias 285 may be formed by one pattern and one etch process. This is possible, in part, because of the larger etch process window that allows adjacent individual vias 285 to be etched at the same time through OPC-link opening 265. This one pattern and one etch is simple, efficient, and cost-effective compared to two pattern and two etch processes.

Figure 5:
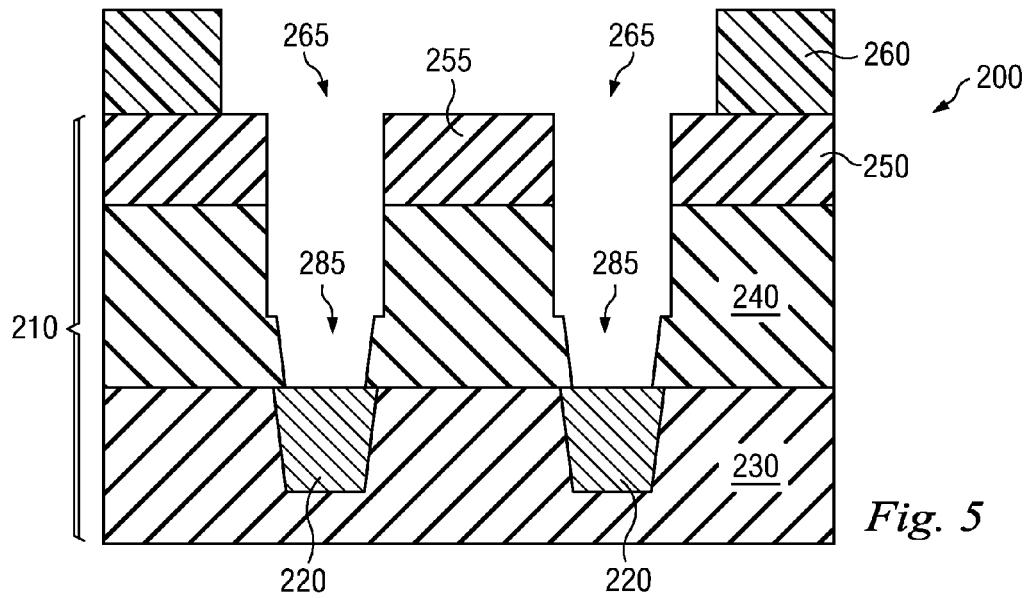

Continuing to block 108, ILD layer 240 is anisotropically etched through the at least one peanut-shaped opening 265 of the patterned photoresist layer 260 to form vias 285 spaced away in the third direction that is different than the first direction. The third direction is different than the direction of the orientation of the two trench openings in hard mask layer 250. As illustrated in FIG. 5, ILD layer 240 is etched through the collective openings of the patterned resist layer 260 and the patterned hard mask 250, resulting in two or more vias 285. The hard mask layer 250 and the patterned photoresist layer 260 are combined to act as an etch mask during via etching.

There is no need to use a photolithography process to define a first via, then etch a via, use a photolithography process to define a second via, and then etch the second via. With the present methods, only one mask, one lithography process, and one via etching process may be used to form one via layer. The present methods reduce cost, decrease process cycle times, and reduce via to via overlap concern.

ILD layer 240 is removed by an etch technique such as plasma etching, dry etch, wet etch, or combinations thereof. Referring to FIG. 5, a via etch process is performed to form vias 285. The via etch process may include several etch sub-steps. Each via etch sub-step may achieve its own etch selectivity and etch profile. Etch selectivity describes an etch rate ratio between different materials being etched. Etch selectivity may be chosen by choosing etchant and etching conditions.

The via etch process may include a dry etch, a wet etch, or a combination of dry and wet etch. For example, a wet etch process may include exposure to a hydroxide containing solution (e.g., ammonium hydroxide), deionized water, and/or other suitable etchant solutions. In another example, a dry etch process may utilize a medium-density plasma etch system equipped with a capacitively coupled plasma source, or a high-density plasma etch system equipped with either inductive, helicon, or electron cyclotron resonance (ECR) plasmas, wherein the exposed material is anisotropically removed by plasma.

The mechanism of etching in each dry-etch process may have a physical basis (e.g. glow-discharge sputtering, or ion milling) or a chemical basis (e.g., in pure plasma etching) or a combination of the both (e.g., reactive ion etching or RIE). Sputtering relies on the directional nature of the incident energetic ions to etch in a highly anisotropic manner. Pure plasma etching, a chemical basis etching, may achieve a very high selectivity against both mask material and underlying layers and typically etch in an isotropic fashion. Combining both physical and chemical mechanism etching offers a controlled anisotropic etch with adequate selectivity.

For example, a first etch sub-step may remove an upper portion of second ILD layer 240, and the first etch sub-step may be designed to remove a portion of ILD layer 240 to create a wide opening for an upper portion of vias 285. The via etch process may continue with a second etch portion to further etch ILD layer 240 through openings defined by the first etch portion. The second etch portion may have a different selectivity. Meanwhile, with the hard mask layer 250 slowing down lateral etching, the first and second etch portion is performed as a self-aligned etch process and the via profile is aligned along the sides or edges of hard mask layer 250 and island feature 255.

Figure 6:
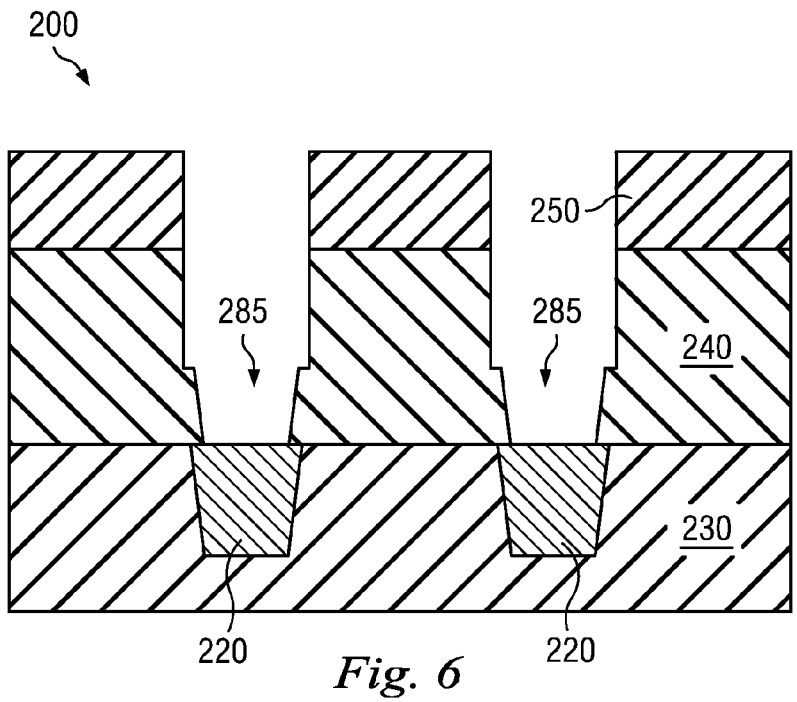

After via etching, as shown in FIG. 6, photoresist layer 260 may be removed by a process such as wet stripping or $O_2$ plasma ashing. The patterned hard mask 250 exposes a portion of the ILD layer 240 to a subsequent trench etch. In step 110, a trench etch is performed to form trenches in the first direction, which is different than the second direction, in the ILD layer 240 through the hard mask 250. The trench etch also further etches the ILD layer 240 within the vias formed by the via etch. Thus, the vias have a first depth and the trenches have a second depth less than the first depth. The via etch using the combined etch mask and the trench etch using the hard mask form the trenches lines and the vias. In the present embodiment, the vias 285 are aligned with the metal features 220 and the trenches are self-aligned with the vias 285.

Figure 7:
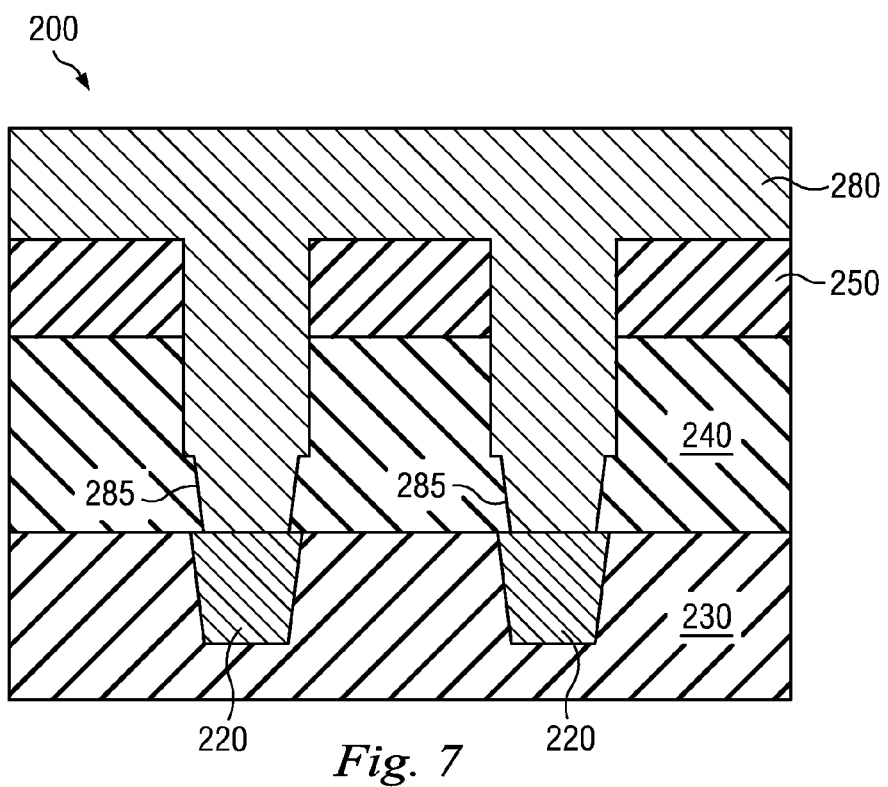

Referring to FIG. 7, the method 100 proceeds to block 112 by filling the individual trenches and vias 285 with a conductive material 280, such as one or more metals, resulting in via (or contact) features and metal lines. The conductive material substantially fills in trenches and vias 285 and additionally deposits on hard mask layer 250. In one embodiment, tungsten, copper, or aluminum is used to fill in individual trenches and vias 285. The metal deposition can use CVD, PVD, plating or a combination thereof. Alternatively, a liner layer, such as titanium nitride or tantalum nitride is deposited on the sidewalls of the trenches and vias, then the conductive material 280 is filled in.

Figure 8:
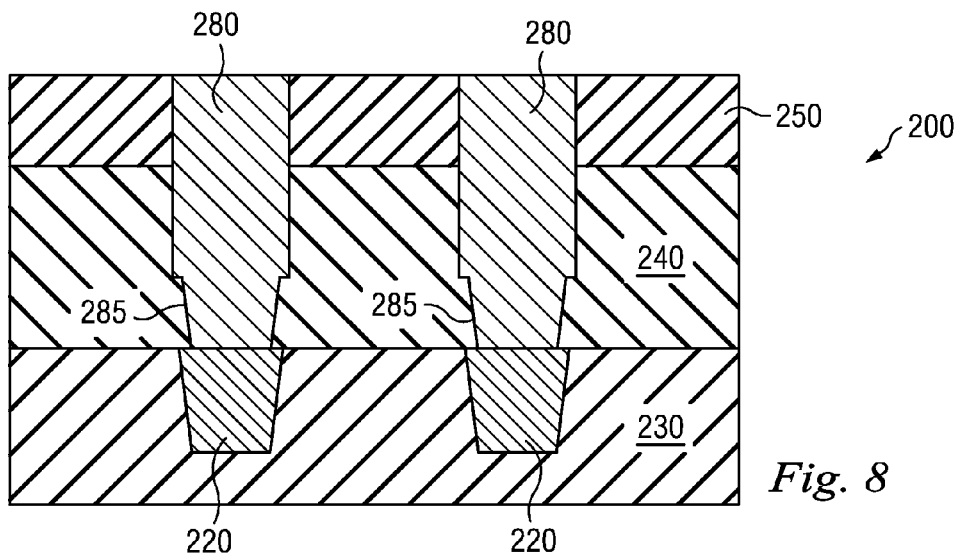

Now referring to FIG. 8, the method continues to block 114 where a chemical mechanical polishing (CMP) process is performed subsequently to remove excess metal layer 280, hard mask layer 250, and portions of ILD layer 240. The CMP process planarizes conductive material 280 and ILD layer 240. In an alternative embodiment, the hard mask layer 250 is used as polishing stop layer and is removed by an etch process after the CMP process.

Figure 9:
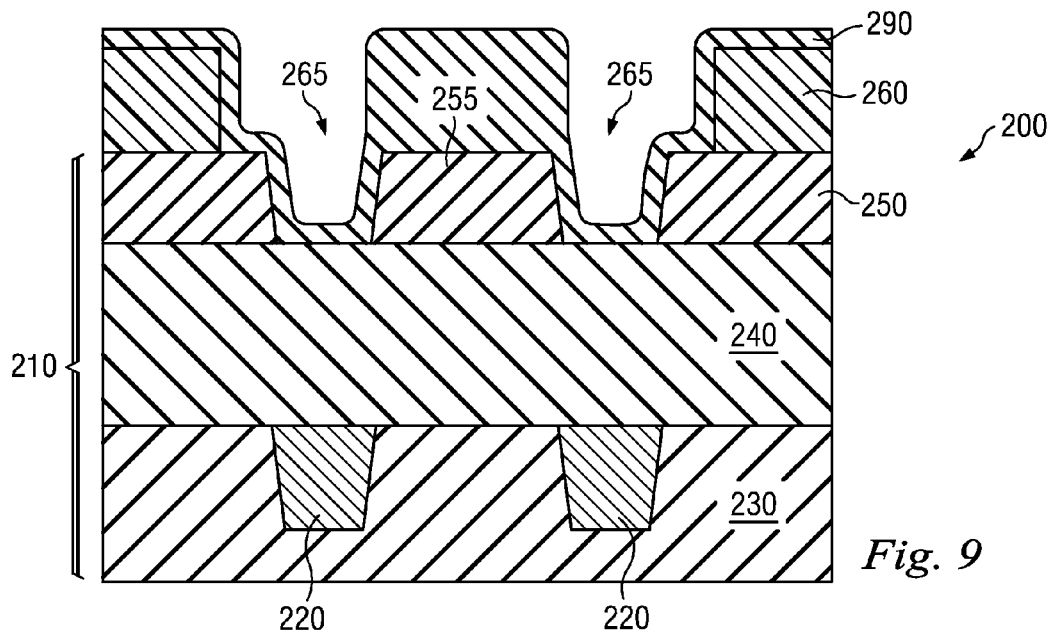

In another embodiment, a spacer layer 290 may be deposited over photoresist layer 260 before the via etching as seen in FIG. 9. Spacer layer 290 is formed by a procedure including deposition and etching. Spacer layer 290 may be formed of the same material as ILD layer 240 or different dielectric material. In one embodiment, spacer layer 290 includes silicon oxide. The spacer layer 290 fills in a necking portion of the peanut shape of the patterned photoresist layer 260 to further separate the two end portions of the opening 265. The openings 265 are defined by the patterned photoresist layer 260 and the spacer layer 290. In one embodiment, the thickness of the spacer is greater than half of the width of the necking portion such that the spacers 290 in the necking portion is filled in and the two end portions of the peanut-shaped openings 265 are completely separated.

Including spacer layer 290 enlarges the etch process window before via etching. Spacer layer 290 further provides an extra etch buffer beside hard mask layer 250 and provide an extra thickness at the island 255 for etching as island feature 255 is consumed during the etching process. Spacer layer 290 ensures an adequate separation between two adjacent individual vias 285. With spacer layer 290 on the sidewall of the openings of hard mask 250, a small via CD can be achieved with a self-aligned characteristic during the etch process.

In another embodiment, the peanut-shaped opening 265 formed by the photomask with OPC link and etch technique are implemented in contact patterning. A photomask with patterns of contacts is prepared, including OPC features that link at least two adjacent patterns to form a peanut shape. The photomask is used to prepare a patterned resist layer. The ILD layer is etched through at least one peanut-shaped opening in the photoresist layer to form two or more contacts. The contacts are filled with conductive material, and a CMP process is performed.

Figure 10:
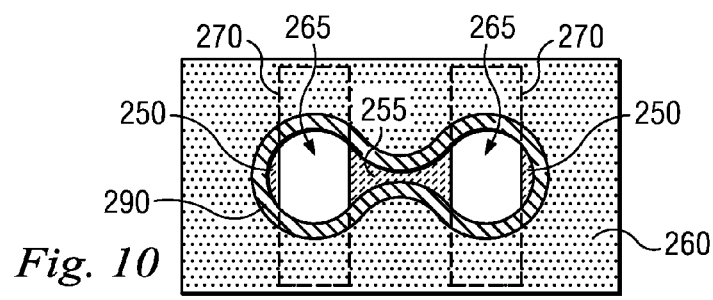

FIG. 10 illustrates the top view of FIG. 9, which shows the peanut shape. As can be seen, the peanut-shaped openings are separated into two openings when the spacer 290 is thick enough. Spacer layer 290 prevents etching of hard mask layer 250, which further prevents lateral etching between opening 265.

The present methods achieve different advantages in various embodiments disclosed herein. For example, the present disclosed methods provide simple, efficient, and cost-effective methods of using a DUV photolithography machine to form vias with small pitches, e.g., 115 nm or less. There is less via to via overlap concern and misalignment concern because of the single-photolithography-single etch process. Less design effort is needed, and similar design rules are followed. No additional efforts need be done to practice the methods.

The present disclosure relates to an integrated (IC) method. In one embodiment, the method includes providing a photomask that includes two main features for two via openings and further includes an optical proximity correction (OPC) feature linking the two main features; forming a hard mask layer on a substrate, the hard mask layer including two trench openings; forming a patterned resist layer over the hard mask layer using the photomask, wherein the patterned resist layer includes a peanut-shaped opening with two end portion aligned with the two trench openings of the hard mask layer, respectively; and performing a first etch process to the substrate using the hard mask layer and the patterned resist layer as a combined etch mask.

The present disclosure also provides one embodiment of an integrated circuit method. The method includes forming a patterned resist layer on a substrate having a peanut-shaped opening; forming a spacer on sidewalls of the peanut-shaped opening of the patterned resist layer such that the spacer fills in a necking portion of the peanut-shaped opening, resulting in two separate openings defined by the patterned resist layer and the spacer, and performing an etch process to the substrate through the two separate openings using the patterned resist layer and the spacer as a combined etch mask.

The present disclosure also provides another embodiment of an integrated circuit (IC) method. The IC method includes receiving an IC design layout for an integrated circuit with via patterns; adding an optical proximity correction (OPC) on the IC design layout to link at least two adjacent via patterns with the OPC feature to form a modified IC design layout, and making a photomask using the modified IC design layout.

The present disclosure further provides yet another embodiment of an IC method. The IC method includes providing a photomask that includes two main features for two via openings and further includes an optical proximity correction (OPC) feature linking the two main features, forming a hard mask layer on a substrate, the hard mask layer including two trench openings, forming a patterned resist layer over the hard mask layer using the photomask, wherein the patterned resist layer includes a peanut-shaped opening with two end portions aligned with the two trench openings of the hard mask layer, respectively, and performing a first etch process to the substrate using the hard mask layer and the patterned resist layer as a combined etch mask.

The present methods provide one exposure and one etching process to achieve a small CD feature with a larger CD lithography tool, e.g., DUV. The methods thus extend the existing lithography tool limitations to a more advance level. Moreover, the present method offer a self-aligned characteristic for via etching process, which relaxes the process window for overlay, reduces misalignment, and increases CD uniformity.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit method, comprising:
    forming a hard mask layer on a substrate, the hard mask layer including two trench openings;
    forming a patterned resist layer over the hard mask layer, wherein the patterned resist layer includes two openings aligned with the two trench openings of the hard mask layer, wherein forming the patterned resist layer over the hard mask layer includes forming the patterned resist layer using a photomask that includes two features and an optical proximity correction feature linking the two features; and
    etching the substrate using the hard mask layer and the patterned resist layer as a combined etch mask.

2. The method of claim 1, wherein the two trench openings each have an elongated shape oriented in a first direction and the two openings of the patterned resist layer are spaced away from each other in a second direction different from the first direction.

3. The method of claim 2, wherein the second direction is orthogonal to the first direction.

4. The method of claim 2, wherein the second direction intersects with the first direction at an angle of less than 90 degrees.

5. The method of claim 2, further comprising forming spacers on sidewalls of the patterned resist layer and the hard mask layer by a procedure including deposition and etching prior to the etching of the substrate.

6. The method of claim 5, wherein the spacers fill in a necking portion between the two openings of the patterned resist layer, resulting in two separate openings defined by the patterned resist layer and the spacers.

7. The method of claim 2, further comprising:
    removing the patterned resist layer after etching the substrate; and thereafter, etching the substrate to form two trenches and two vias in the substrate.

8. The method of claim 7, further comprising:
filling the two trenches and the two vias with a conductive material; and
planarizing the conductive material and the substrate.

9. The method of claim 1, wherein etching the substrate includes etching an interlayer dielectric (ILD) layer.

10. An integrated circuit (IC) method, comprising:
forming a patterned resist layer having two openings on a substrate, wherein forming the patterned resist layer includes forming the patterned resist layer using a photomask that includes two features and an optical proximity correction feature linking the two features;
depositing a spacer layer on sidewalls of the two openings and in between the two openings; and
etching the substrate through the two openings using the patterned resist layer and the spacer layer as a combined etch mask.

11. The method of claim 10, wherein the two openings of the patterned resist layer correspond to an image of the two features and the OPC feature of the photomask.

12. The method of claim 10, wherein the substrate includes a dielectric material layer formed on a semiconductor wafer and the etching includes etching the dielectric material layer.

13. The method of claim 12, further comprising forming, on the dielectric material layer, a hard mask having two trench openings before forming the patterned resist layer on the substrate, wherein the two openings of the patterned resist layer overlap with the two trench openings of the hard mask.

14. The method of claim 13, further comprising:
removing the patterned resist layer;
thereafter, etching the dielectric material layer to form two trenches and two vias in the dielectric material layer;
depositing a conductive material in the two trenches and two vias; and
performing a chemical mechanical polishing (CMP) process to remove excess conductive material on the dielectric material layer.

15. The method of claim 10, wherein depositing the spacer layer includes forming the spacer layers by a procedure including depositing a dielectric film and anisotropically etching the dielectric film.

16. An integrated circuit (IC) method, comprising:
forming a dielectric material layer on a substrate;
forming, on the dielectric material layer, a hard mask having two trench openings;
forming a patterned resist layer on the hard mask, wherein the patterned resist layer includes two openings that overlap with the two trench openings, wherein forming the patterned resist layer on the hard mask includes forming the patterned resist layer using a photomask that includes two features and an optical proximity correction (OPC) feature linking the two features; and
etching the dielectric material layer using the hard mask and the patterned resist layer as a combined etch mask.

17. The method of claim 16, further comprising:
receiving an IC design layout for an integrated circuit with via patterns;
adding the OPC feature on the IC design layout to link the two features with the OPC feature to form a modified IC design layout; and
making the photomask using the modified IC design layout.

18. The method of claim 16, further comprising
removing the patterned resist layer; and
thereafter, etching the dielectric material layer through the two trench openings of the hard mask, resulting in trench lines and vias in the dielectric material layer.

19. The method of claim 16, further comprising forming a spacer layer within the two openings and the two trench openings prior to etching the dielectric material layer using the hard mask and the patterned resist layer as the combined etch mask.

20. The method of claim 16, forming a conductive feature within the two trench openings.

* * * * *